(12) United States Patent
Maislos

(10) Patent No.: US 9,230,672 B2
(45) Date of Patent: *Jan. 5, 2016

(54) HIGH-RESOLUTION READOUT OF ANALOG MEMORY CELLS

(71) Applicant: Apple Inc., Cupertino, CA (US)

(72) Inventor: Ariel Maislos, Bnei Tzion (IL)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/259,317

(22) Filed: Apr. 23, 2014

(65) Prior Publication Data

US 2014/0233310 A1    Aug. 21, 2014

Related U.S. Application Data

(63) Continuation of application No. 13/560,047, filed on Jul. 27, 2012, now Pat. No. 8,743,605.

(60) Provisional application No. 61/534,389, filed on Sep. 14, 2011.

(51) Int. Cl.
  *G11C 16/04*   (2006.01)
  *G11C 16/26*   (2006.01)
  *G11C 27/00*   (2006.01)

(52) U.S. Cl.
  CPC .............. *G11C 16/26* (2013.01); *G11C 27/005* (2013.01); *G11C 16/0483* (2013.01)

(58) Field of Classification Search
  USPC ................... 365/185.03, 185.18, 185.25
  See application file for complete search history.

(56) References Cited

U.S. PATENT DOCUMENTS

| | | |
|---|---|---|
| 6,801,445 B2 | 10/2004 | Knodgen |
| 6,909,639 B2 | 6/2005 | Park et al. |
| 7,697,326 B2 | 4/2010 | Sommer et al. |
| 7,821,826 B2 | 10/2010 | Shalvi et al. |
| 7,898,876 B2 | 3/2011 | Yang et al. |
| 7,898,885 B2 | 3/2011 | Sarin et al. |
| 8,000,141 B1 * | 8/2011 | Shalvi et al. ............ 365/185.09 |
| 8,072,812 B2 * | 12/2011 | Roohparvar et al. ..... 365/185.17 |
| 8,116,139 B2 | 2/2012 | Kuo et al. |
| 8,230,300 B2 | 7/2012 | Perlmutter et al. |
| 8,527,819 B2 | 9/2013 | Shalvi et al. |
| 8,743,605 B2 * | 6/2014 | Maislos ................... 365/185.03 |
| 8,832,354 B2 * | 9/2014 | Sokolov et al. ............... 711/103 |
| 8,977,805 B2 * | 3/2015 | Maislos et al. ................ 711/103 |
| 2005/0169095 A1 | 8/2005 | Bedeschi et al. |

* cited by examiner

*Primary Examiner* — Pho M Luu
(74) *Attorney, Agent, or Firm* — Meyertons, Hood, Kivlin, Kowert & Goetzel, P.C.

(57) ABSTRACT

A method includes storing data in an analog memory cell by writing an analog value into the memory cell. After storing the data, the data stored in the memory cell is read by discharging electrical current to flow through the memory cell, during a predefined time interval, while applying a variable voltage to a gate of the memory cell. A fraction of the predefined time interval, during which the variable voltage allows the electrical current to flow through the memory cell, is estimated. The stored data is estimated based on the estimated fraction.

20 Claims, 2 Drawing Sheets

HIGH-RESOLUTION READOUT OF ANALOG MEMORY CELLS

CROSS-REFERENCE TO RELATED APPLICATIONS

This application is a continuation application of U.S. patent application Ser. No. 13/560,047, filed Jul. 27, 2012, now U.S. Pat. No. 8,743,605, which claims the benefit of U.S. Provisional Patent Application 61/534,389, filed Sep. 14, 2011, whose disclosure is incorporated herein by reference.

FIELD OF THE INVENTION

The present invention relates generally to memory devices, and particularly to methods and circuits for reading analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

SUMMARY OF THE INVENTION

An embodiment of the present invention that is described herein provides a method, which includes storing data in an analog memory cell by writing an analog value into the memory cell. After storing the data, the data stored in the memory cell is read by discharging electrical current to flow through the memory cell, during a predefined time interval, while applying a variable voltage to a gate of the memory cell. A fraction of the predefined time interval, during which the variable voltage allows the electrical current to flow through the memory cell, is estimated. The stored data is estimated based on the estimated fraction.

In some embodiments, estimating the stored data includes estimating the analog value written to the memory cell based on the fraction, and deriving the stored data from the estimated analog value. In an embodiment, applying the variable voltage includes applying a saw-tooth voltage waveform to the gate of the memory cell. In an embodiment, applying the variable voltage includes applying to the gate of the memory cell a voltage waveform that sweeps over a predefined range of voltages during the predefined time interval.

In some embodiments, estimating the fraction includes measuring an integral of the electrical current flowing through the memory cell over the predefined time interval. In a disclosed embodiment, discharging the electrical current includes charging a capacitance that is connected in series with the memory cell, and measuring the integral of the electrical current includes measuring an electrical charge level of the capacitance following the predefined time interval. The capacitance may include a capacitor connected in series with the memory cell. Additionally or alternatively, the capacitance may include a self capacitance of a bit line that includes the memory cell.

In another embodiment, estimating the stored data includes digitizing the integral of the electrical current to produce a digital value that is indicative of the stored data. In yet another embodiment, the integral of the electrical current is one of multiple integrals measured for multiple respective memory cells, and the method includes reading the multiple integrals serially by progressively shifting the integrals.

In some embodiments, estimating the fraction includes measuring time period during which the memory cell conducts. In some embodiments, the method includes adaptively adjusting a slope of the variable voltage applied to the gate.

There is additionally provided, in accordance with an embodiment of the present invention, apparatus including an analog memory cell and storage circuitry. The storage circuitry is configured to store data in the memory cell by writing an analog value into the memory cell, and, after storing the data, to read the data stored in the memory cell by discharging electrical current to flow through the memory cell while applying a variable voltage to a gate of the memory cell during a predefined time interval, estimating a fraction of the predefined time interval during which the variable voltage allows the electrical current to flow through the memory cell, and estimating the stored data based on the estimated fraction.

DETAILED DESCRIPTION OF EMBODIMENTS

Overview

Figure 1:
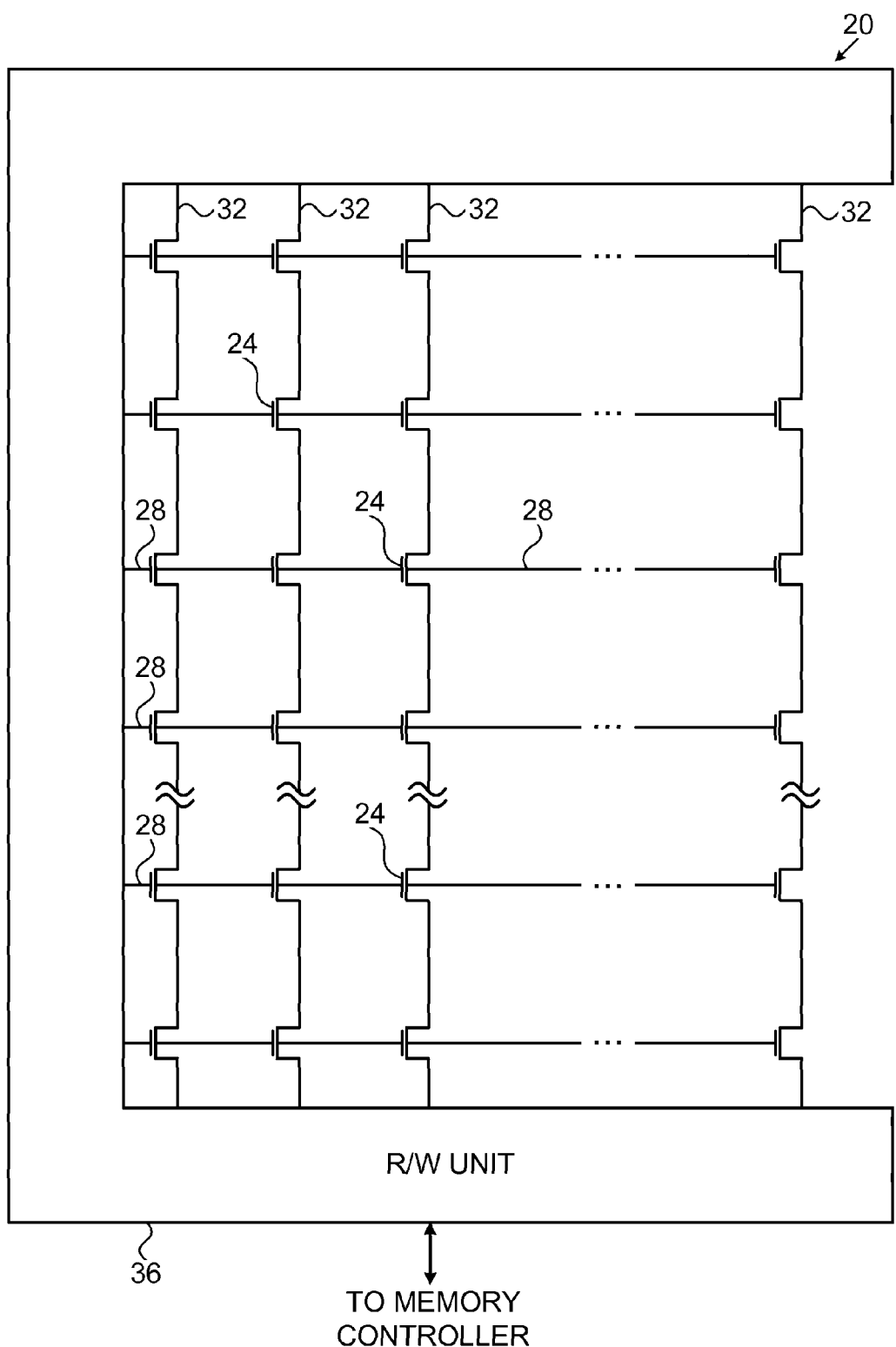
FIG. 1 is a block diagram that schematically illustrates a memory comprising an array of analog memory cells, in accordance with an embodiment of the present invention.

Data is typically stored in analog memory cells by programming the cells to assume certain quantities of an analog value, such as an electrical charge or voltage. The analog value stored in the cell can be read by measuring the cell threshold voltage, which is defined as the minimal voltage that needs to be applied to the gate of the cell in order for the cell to start conducting.

Typically, analog memory cells are arranged in rows associated with respective word lines and columns associate with respective bit lines. In most conventional analog memory cell arrays, the threshold voltage of a memory cell is read by charging the bit line of the cell, allowing the bit line to discharge while applying certain read voltage to the word line of the cell, and sensing the bit line current or voltage. Multiple memory cells along the word line are typically read in parallel in this manner.

Embodiments of the present invention that are described hereinbelow provide improved methods and devices for reading analog memory cells. In the disclosed embodiments, the voltage applied to the word line is variable rather than fixed, for example a saw-tooth waveform. When subjected to a variable word line voltage, a memory cell will conduct only during a fraction of the time in which the word line voltage exceeds the cell threshold voltage. Therefore, the fraction of time in which the cell (and consequently the bit line) conducts depends on the cell threshold voltage.

In some embodiments, the above mechanism is used for reading the cell threshold voltage (and thus the data stored in the cell) with high resolution. In an example embodiment, storage circuitry applies the variable word line voltage over a predefined time interval, and estimates the fraction of the predefined time interval during which the variable word line voltage causes the memory cell to conduct. For example, the storage circuitry may integrate the bit line current over the predefined time interval, and use the integral of the bit line current as an estimate of the cell threshold voltage.

If the cell threshold voltage is high, it will conduct during a relatively small fraction of the time interval, and the integral will be small. If the cell threshold voltage is low, the word line voltage will exceed the threshold voltage during most of the time interval, and the integral will be large. Using this technique, the storage circuitry can read the cell threshold voltage with high resolution, using simple hardware and performing only a single sense operation. Reaching comparable resolution using conventional readout techniques would require a large number of sense operations with multiple read voltages, as well as complex circuitry.

Several example implementations of the storage circuitry are described herein. In an example embodiment, the storage circuitry comprises a capacitor that is connected in series to the bit line, and an Analog-to-Digital Converter (ADC) that digitizes the voltage across the capacitor at the end of the time interval.

System Description

FIG. 1 is a block diagram that schematically illustrates a memory 20 comprising an array of analog memory cells 24, in accordance with an embodiment of the present invention. In the present example, memory cells 24 comprise floating-gate NAND Flash cells. In the context of the present patent application and in the claims, however, the term "analog memory cell" is used to describe any memory cell that holds a continuous, analog value of a physical parameter, such as an electrical voltage or charge. Memory cells 24 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

Memory 20 stores data in memory cells 24 by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. Thus, after programming, each memory cell 24 holds an analog value that represents a respective data value (of one or more bits) stored in the cell.

A certain amount of electrical charge (electrons or holes) can be stored in a particular cell 24 by applying appropriate voltage levels to the transistor gate, source and drain. The value stored in the cell can be read by measuring the threshold voltage of the cell (denoted $V_{TH}$), which is defined as the minimal voltage that needs to be applied to the gate of the transistor in order to cause the transistor to reach a given level of electrical conductance, assuming the gates of the other cells in the string are biased with nominal pass voltages. The read threshold voltage is indicative of the charge stored in the cell.

In an example configuration of memory 20, memory cells 24 are arranged in multiple rows and columns, and each memory cell comprises a floating-gate transistor. The gates of the cells in each row are connected by word lines 28, and the sources of the cells in each column are connected by bit lines 32. The memory cells (transistors) along each bit line 32 are connected source-to-drain in series with one another.

In alternative embodiments, the memory cells of a given word line are divided into groups that are referred to as strings. The memory cells in each string are connected source-to-drain in series with one another, between the bit line and ground. Each string can typically be connected and disconnected individually to the bit line.

Memory 20 comprises a reading/writing (R/W) unit 36, which writes and reads data in memory cells 24. In a typical embodiment, the R/W unit converts the data for storage into analog storage values, applies the appropriate voltages to the bit lines and word lines of the memory, and writes the analog values into memory cells 24. When reading data out of memory cells 24, R/W unit 36 typically converts the analog values of the memory cells into digital samples having a resolution of one or more bits. Unit 36 is typically connected to a memory controller or other external system over a suitable interface.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing and buffering circuits, timing and sequencing circuits and debugging circuits, have been omitted from the figure for clarity.

Figure 2:
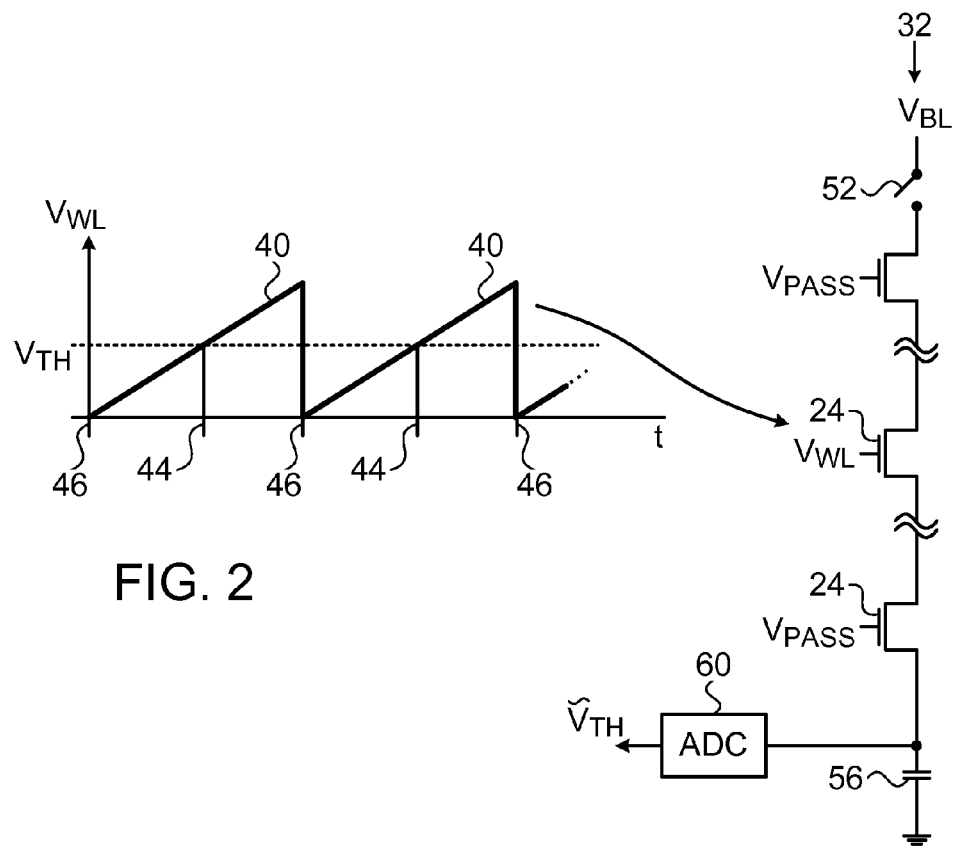
FIG. 2 is a diagram that schematically illustrates analog memory cells along a bit line and associated readout voltages, in accordance with an embodiment of the present invention.

FIG. 2 is a diagram that schematically illustrates analog memory cells 24 along a bit line 32 and associated readout voltages, in accordance with an example embodiment of the present invention. The present example focuses on a single string of memory cells, for the sake of clarity.

The memory cells in the string are connected source-to-drain in series with one another. The source of the first memory cell in the string is connected to the bit line via a selection switch 52. The selection switch is controlled by R/W unit 36, which typically closes the switch when accessing memory cells in the string and opens the switch otherwise. (A given bit line is typically connected to multiple strings.) The bit line voltage is denoted $V_{BL}$.

The drain of the last memory cell in the string is connected to ground via a capacitor 56. A Analog-to-Digital Converter (ADC) 60 digitizes the voltage across capacitor 56. As will be explained in detail below, the output of ADC 60 is used as an estimate of the cell threshold voltage. The ancillary circuitry of the string, e.g., switch 52, capacitor 56 and ADC 60 are regarded as part of R/W unit 36 of FIG. 1. R/W unit 36, including for example switch 52, capacitor 56 and ADC 60 and/or any other suitable components, is referred to herein as storage circuitry that programs and reads memory cells 24.

As described above, the gates of memory cells 24 along each row of the array are connected to a respective word line 28. Each memory cell in a given row belongs to a different string.

R/W unit 36 typically reads the threshold voltage $V_{TH}$ of a given memory cell 24 in the string by:

- Applying a certain word line voltage denoted $V_{WL}$ to the word line to which the memory cell belongs. This word line is referred to as a selected word line or target word line.
- Applying a pass voltage, denoted $V_{PASS}$, to the word lines to which the other memory cells in the string belong. These word lines are referred to as unselected word lines.
- Pre-charging the bit line in question to $V_{BL}$.
- Connecting the string to which the memory cell belongs to the bit line using the appropriate selection switch 52.
- Enabling electrical current to flow through the string, i.e., allowing the bit line to discharge through the string, and estimating $V_{TH}$ from the current.

This sort of read operation is typically applied in parallel to multiple cells along a given word line, often to the entire word line.

For a given value of the word line voltage $V_{WL}$, the string will typically conduct only when the threshold voltage $V_{TH}$ of the target memory cell is lower than $V_{WL}$. The pass voltages $V_{PASS}$ are typically selected to be sufficiently high, so that the memory cells other than the cell being read will conduct regardless of their charge levels.

Reading Analog Memory Cells Using Variable Word Line Voltage

In some embodiments, R/W unit 36 reads memory cells 24 with high resolution by applying a variable word line voltage $V_{WL}$ to the selected word line during the readout process. The description that follows describes this technique with regards to a single memory cell, for the sake of clarity. In a typical implementation, however, the disclosed readout process is applied simultaneously to multiple memory cells along the selected word line.

The left-hand-side of FIG. 2 shows an example of a variable word line voltage $V_{WL}$ that is applied by unit 36 to the selected word line, as a function of time. In the present example, the word line voltage comprises a periodic saw-tooth or triangular waveform 40. In alternative embodiments, however, the variable word line voltage may comprise any other suitable waveform that sweeps over a predefined range of voltages. For example, the word line voltage may comprise a sinusoidal waveform.

Typically, although not necessarily, the waveform of $V_{WL}$ should be continuous, monotonically rising to its maximum value and then monotonically dropping to its minimum value. When using such waveforms, a larger cell threshold voltage will result in smaller integration time, so the dependence of integration time on the threshold voltage will be monotonic and thus reversible. Generally, however, other continuous waveforms, such as multiple periodic cycles of a certain waveform, can also be used.

Linear waveforms (such as saw-tooth or triangular waveforms) will result in uniform accuracy across the entire range. Non-linear waveforms such as a sinusoidal waveform (or more accurately—the first half period of a sine wave) will typically result in non-uniform accuracy, since the threshold voltage for which the waveform has lower slope will have better accuracy. This non-uniform accuracy may be preferable in some cases, for example when there are less-interesting sub-ranges where the cell threshold voltage is not expected to be, and therefore $V_{WL}$ can have a larger slope in these sub-ranges. The waveform shape will determine the conversion formula from integrated current to threshold voltage.

Consider a memory cell that is programmed with data represented by a threshold voltage $V_{TH}$, and is read while its word line voltage is varied in accordance with saw-tooth waveform 40. The assumption is that the bit line of this memory cell is charged at the beginning of each saw-tooth cycle (at times 46), and at that time switch 52 is closed and the bit line voltage is discharged through the string. It is also assumed that capacitor 56 is discharged, i.e., stores no electrical charge, at times 46.

At the beginning of each saw-tooth cycle, at times 46, the memory cell does not conduct because $V_{WL} < V_{TH}$. Therefore, the entire string does not conduct at this stage, current does not flow through the string, and capacitor 56 does not accumulate electrical charge.

When the saw-tooth waveform reaches times 44 in which $V_{WL} = V_{TH}$, the memory cell begins to conduct and the bit line begins to discharge through the string. Current begins to flow through the string, and continues to do so during the entire interval between time 44 and time 46. During this interval, capacitor 56 accumulates electrical charge.

Thus, the amount of electrical charge stored in capacitor 56 at the end of each saw-tooth cycle is indicative of the integral of the bit line current over the time interval over the cycle of waveform 40. The integral of the bit line current takes different values for different values of $V_{TH}$: Higher $V_{TH}$ will typically result in a lower integral (since the memory cell will begin to conduct later in the cycle of waveform 40), and vice versa. The integral of the bit line current over a predefined time interval can thus be used as an estimate of the cell $V_{TH}$, and thus as an estimate of the data that is stored in the cell.

In some embodiments, unit 36 measures the integral of the bit line current over a given time interval, and estimates the $V_{TH}$ of the cell based on the measured integral. Unit 36 reconstructs the stored data based on the estimated $V_{TH}$. In an embodiment, unit 36 deduces the data value directly from the measured integral, without going through $V_{TH}$ estimation. The time interval may comprise a single cycle of waveform 40, more than a single cycle (including a non-integer number of cycles) or any other suitable interval.

In the embodiments described herein, unit 36 measures the integral of the bit line current by measuring the electrical charge that is accumulated in capacitor 56. For example, unit 36 may measure the voltage across the capacitor. In the example of FIG. 2, A/D 60 digitizes the voltage across capacitor 56, so as to produce a digital value $\hat{V}_T$ that is indicative of the data stored in the memory cell.

In an alternative embodiment, the self capacitance of the bit line plays the role of capacitor 56, without a need for an additional component. In this embodiment, unit 36 measures the bit line voltage at the end of the time interval and uses this voltage as an indication of the stored data. Further alternatively, unit 36 may measure the integral of the bit line current using any other suitable technique, not necessarily using a capacitor.

Because of the variable word line voltage that is applied during readout, unit 36 is able to estimate the cell $V_{TH}$ with high accuracy and resolution, even though only a single sense operation is performed.

The slope of saw-tooth waveform 40 affects the accuracy of the $V_{TH}$ estimation. A smaller slope typically results in higher accuracy, but on the other hand requires longer readout time (because of the need to sweep the entire threshold voltage range of interest with that slope). In some embodiments, unit 36 adjusts the slope of waveform 40 adaptively to set the desired trade-off. For a given target accuracy, it is also possible to perform two or more integration cycles using a certain slope, instead of using a reduced slope.

In some embodiments, unit 36 reads the voltages of multiple capacitors (belonging to multiple respective bit lines) in a serial manner. In an example embodiment, unit 36 comprises circuitry (not shown in the figure) that shifts the voltages progressively from one capacitor to the next, similarly to serial readout of a Charge Coupled Device (CCD).

Figure 3:
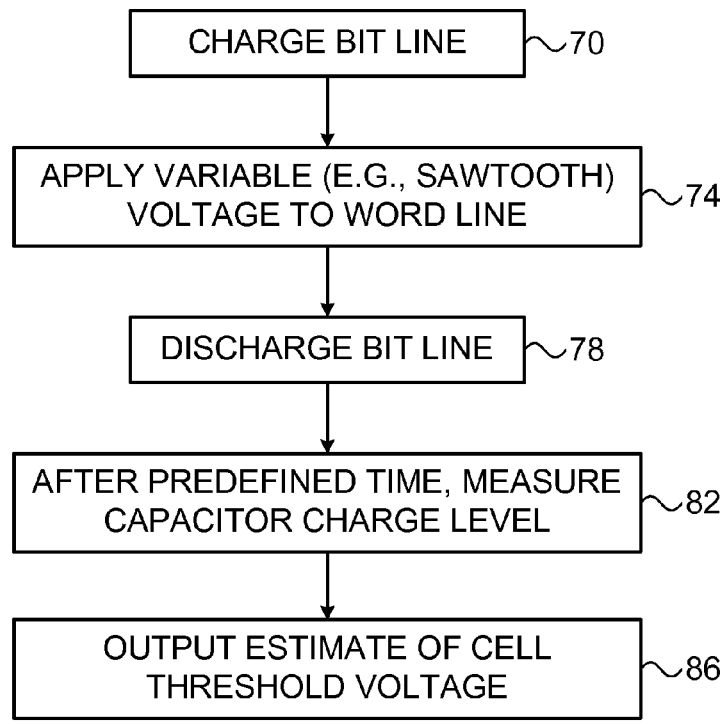
FIG. 3 is a flow chart that schematically illustrates a method for reading analog memory cells, in accordance with an embodiment of the present invention.

FIG. 3 is a flow chart that schematically illustrates a method for reading analog memory cells 24, in accordance with an embodiment of the present invention. The sequence of steps described below refers to a single cycle of waveform 40.

The method begins at time 46, with R/W unit 36 charging the bit line while switch 52 is open, at a charging step 70. Unit 36 applies variable voltage waveform 40 to the word line of a memory cell to be read, at a voltage application step 74. Unit 36 applies a pass voltage $V_{PASS}$ to the other word lines.

Still at time 46, unit 36 closes switch 52 and thus discharges the bit line through the string, at a discharging step 78. After a predefined time interval from the beginning of the discharge cycle, for example at the next time 46 (after a period of waveform 40), unit 36 measures the voltage across capacitor 56 using ADC 60, at a readout step 82. Unit 36 outputs an estimate of the cell $V_{TH}$, or of the corresponding data value, at an output step 86.

In the embodiments described above, the storage circuitry estimates the fraction of time during which the variable word line voltage causes the memory cell to conduct, by integrating the current flowing through the memory cell. In alternative embodiments, however, the storage circuitry may perform any other suitable measurement or estimation that is indicative of the fraction of time. For example, the storage circuitry may perform an explicit time measurement that determines the length of time during which the cell conducts.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for operating a memory, wherein the memory includes a plurality of memory cells, the method comprising:
  charging a bit line coupled to a selected one of the plurality of memory cells to a predetermined voltage;
  discharging the bit line through the selected one of the plurality of memory cells;
  estimating data stored in the selected one of the plurality of memory cells dependent upon a current resulting from the discharging of the bit line.

2. The method of claim 1, wherein discharging the bit line through the selected one of the plurality of memory cells comprises applying a variable voltage level to a gate of the selected one of the plurality of memory cells.

3. The method of claim 2, wherein applying the variable voltage level to the gate of the selected one of the plurality of memory cells comprises apply the variable voltage level to the gate of the selected one of the plurality of memory cells over a predetermine period of time.

4. The method of claim 3, wherein estimating the data stored in the selected one of the plurality of memory cells comprises estimating a portion of the predetermined period of time during which current flows through the selected one of the plurality of memory cells.

5. The method of claim 1, wherein discharging the bit line through the selected one of the plurality of memory cells comprises charging a capacitance, wherein the capacitance is coupled in series with the selected one of the plurality of memory cells.

6. The method of claim 5, wherein the capacitance includes a self capacitance of the bit line.

7. An apparatus, comprising:
  a plurality of memory cells; and
  circuitry coupled to the plurality of memory cells, wherein the circuitry is configured to:

charge a bit line coupled to a selected one of the plurality of memory cells to a predetermined voltage;

discharge the bit line through the selected one of the plurality of memory cells;

estimate data stored in the selected one of the plurality of memory cells dependent upon a current resulting from the discharging of the bit line.

8. The apparatus of claim 7, wherein to discharge the bit line through the selected one of the plurality of memory cells, the circuitry is further configured to apply a variable voltage level to a gate of the selected one of the plurality of memory cells.

9. The apparatus of claim 8, wherein to apply the variable voltage level to the gate of the selected one of the plurality of memory cells, the circuitry is further configured to apply the variable voltage level to the gate of the selected one of the plurality of memory cells over a predetermine period of time.

10. The apparatus of claim 9, wherein to estimate the data stored in the selected one of the plurality of memory cells, the circuitry is further configured to estimate a portion of the predetermined period of time during which current flows through the selected one of the plurality of memory cells.

11. The apparatus of claim 7, wherein the circuitry includes a capacitance coupled in series with the selected one of the plurality of memory cells, and wherein to discharge the bit line through the selected one of the plurality of memory cells the circuitry is further configured to charge the capacitance dependent upon the current.

12. The apparatus of claim 11, wherein the capacitance includes a self capacitance of the bit line.

13. The apparatus of claim 11, wherein the capacitance includes a capacitor coupled in series with the selected one of the plurality of memory cells.

14. A memory, comprising:
a plurality of memory cells;
circuitry coupled to the plurality of memory cells, wherein the circuitry is configured to:
charge a bit line coupled to a selected one of the plurality of memory cells to a predetermined voltage;
discharge the bit line through the selected one of the plurality of memory cells; and
an analog-to-digital converter (ADC) configured to estimate data stored in the selected one of the plurality of memory cells dependent upon a current resulting from the discharging of the bit line.

15. The system of claim 14, wherein to discharge the bit line through the selected one of the plurality of memory cells, the circuitry is further configured to apply a variable voltage level to a gate of the selected one of the plurality of memory cells.

16. The system of claim 15, wherein to apply the variable voltage level to the gate of the selected one of the plurality of memory cells, the circuitry is further configured to apply the variable voltage level to the gate of the selected one of the plurality of memory cells over a predetermine period of time.

17. The system of claim 16, wherein to estimate the data stored in the selected one of the plurality of memory cells, the ADC is further configured to estimate a portion of the predetermined period of time during which current flows through the selected one of the plurality of memory cells.

18. The system of claim 14, wherein the circuitry includes a capacitance coupled in series with the selected one of the plurality of memory cells, and wherein to discharge the bit line through the selected one of the plurality of memory cells the circuitry is further configured to charge the capacitance dependent upon the current.

19. The system of claim 18, wherein the capacitance includes a self capacitance of the bit line.

20. The system of claim 18, wherein the capacitance includes a capacitor coupled in series with the selected one of the plurality of memory cells.

* * * * *